United States Patent
Tchakarov et al.

(10) Patent No.: US 8,339,031 B2
(45) Date of Patent: Dec. 25, 2012

(54) SUBSTRATE FOR AN ORGANIC LIGHT-EMITTING DEVICE, USE AND PROCESS FOR MANUFACTURING THIS SUBSTRATE, AND ORGANIC LIGHT-EMITTING DEVICE

(75) Inventors: Svetoslav Tchakarov, Arcueil (FR); Hadia Gerardin, Paris (FR); Pascal Reutler, Paris (FR); Didier Jousse, Taverny (FR); Eric Mattmann, Paris (FR); Pascal Nael, Aubervilliers (FR)

(73) Assignee: Saint-Gobain Glass France, Courbevoie (FR)

( * ) Notice: Subject to any disclaimer, the term of this patent is extended or adjusted under 35 U.S.C. 154(b) by 197 days.

(21) Appl. No.: 12/440,301

(22) PCT Filed: Sep. 5, 2007

(86) PCT No.: PCT/FR2007/051876
§ 371 (c)(1),
(2), (4) Date: Jul. 1, 2009

(87) PCT Pub. No.: WO2008/029060
PCT Pub. Date: Mar. 13, 2008

(65) Prior Publication Data
US 2010/0072884 A1    Mar. 25, 2010

(30) Foreign Application Priority Data

Sep. 7, 2006   (FR) ...................................... 06 53617
Nov. 17, 2006  (FR) ...................................... 06 54952

(51) Int. Cl.
*H01L 51/52* (2006.01)
*H01L 51/56* (2006.01)

(52) U.S. Cl. ........ 313/503; 313/506; 313/509; 427/99.5; 427/126.3

(58) Field of Classification Search .......... 313/500–512; 427/58, 99.5, 126.1–126.6
See application file for complete search history.

(56) References Cited

U.S. PATENT DOCUMENTS

| | | |
|---|---|---|
| 4,649,432 A | 3/1987 | Watanabe et al. |
| 5,280,373 A | 1/1994 | Ozawa et al. |
| 5,346,770 A | 9/1994 | Osada et al. |
| 5,667,853 A | 9/1997 | Fukuyoshi et al. |

(Continued)

FOREIGN PATENT DOCUMENTS

DE    197 33 053    2/1999

(Continued)

OTHER PUBLICATIONS

U.S. Appl. No. 12/515,200, filed May 15, 2009, Tchakarov, et al.

(Continued)

*Primary Examiner* — Mariceli Santiago
(74) *Attorney, Agent, or Firm* — Oblon, Spivak, McClelland, Maier & Neustadt, L.L.P.

(57) ABSTRACT

A substrate for an organic light-emitting device, especially a transparent glass substrate, which includes, on a first main face, a bottom electrode film, the electrode film being formed from a thin-film multilayer coating comprising, in succession, at least: a contact layer based on a metal oxide and/or a metal nitride; a metallic functional layer having an intrinsic electrical conductivity property; an overlayer based on the metal oxide and/or a metal nitride, especially for matching the work function of said electrode film, said substrate including a base layer, said base layer covering said main face.

36 Claims, 4 Drawing Sheets

U.S. PATENT DOCUMENTS

| | | | |
|---|---|---|---|
| 5,962,115 | A | 10/1999 | Zmelty et al. |
| 6,014,196 | A | 1/2000 | Anzaki et al. |
| 6,040,056 | A | 3/2000 | Anzaki et al. |
| 6,045,896 | A | 4/2000 | Boire et al. |
| 6,414,431 | B1 | 7/2002 | Yu et al. |
| 6,489,045 | B1 | 12/2002 | Araki et al. |
| 7,049,757 | B2 | 5/2006 | Foust et al. |
| 7,161,171 | B2 * | 1/2007 | Dahmani et al. ............. 257/40 |
| 2002/0008286 | A1 | 1/2002 | Yamazaki et al. |
| 2003/0049464 | A1 | 3/2003 | Glenn et al. |
| 2003/0162333 | A1 | 8/2003 | Kim et al. |
| 2003/0186064 | A1 | 10/2003 | Murata et al. |
| 2004/0001915 | A1 | 1/2004 | He et al. |
| 2004/0031957 | A1 | 2/2004 | Tyan |
| 2004/0032220 | A1 | 2/2004 | Cok et al. |
| 2004/0081855 | A1 | 4/2004 | Seop et al. |
| 2004/0113146 | A1 | 6/2004 | Dahmani et al. |
| 2004/0149984 | A1 | 8/2004 | Tyan et al. |
| 2004/0245918 | A1 | 12/2004 | Lee |
| 2005/0000564 | A1 | 1/2005 | Sato et al. |
| 2005/0073228 | A1 | 4/2005 | Tyan et al. |
| 2005/0073251 | A1 | 4/2005 | Kato |
| 2005/0124257 | A1 | 6/2005 | Maeuser |
| 2005/0162071 | A1 | 7/2005 | Lee et al. |
| 2005/0199904 | A1 | 9/2005 | Yamamoto |
| 2005/0264185 | A1 | 12/2005 | Hoffmann |
| 2006/0043886 | A1 | 3/2006 | Lee et al. |
| 2006/0091791 | A1 | 5/2006 | Shin |
| 2006/0124933 | A1 | 6/2006 | Kang |
| 2006/0152833 | A1 | 7/2006 | Halls et al. |
| 2006/0209551 | A1 * | 9/2006 | Schwenke et al. ........... 313/506 |
| 2006/0269786 | A1 | 11/2006 | Shin et al. |
| 2006/0290841 | A1 | 12/2006 | Kwon et al. |
| 2007/0206263 | A1 | 9/2007 | Neuman et al. |
| 2008/0100202 | A1 | 5/2008 | Cok |

FOREIGN PATENT DOCUMENTS

| | | |
|---|---|---|
| DE | 20 2005 000 979 | 7/2006 |
| EP | 0 733 931 | 9/1996 |
| EP | 0 747 330 | 12/1996 |
| EP | 0 847 965 | 6/1998 |
| EP | 1 329 307 | 7/2003 |
| EP | 1 396 676 | 3/2004 |
| EP | 1 403 939 | 3/2004 |
| EP | 1 521 305 | 4/2005 |
| EP | 1 693 483 | 8/2006 |
| EP | 1 717 876 | 11/2006 |
| FR | 2 844 136 | 3/2004 |
| JP | 10-100303 | 4/1998 |
| JP | 10-217378 | 8/1998 |
| JP | 11-070610 | 3/1999 |
| JP | 2001-243840 | 9/2001 |
| JP | 2002-015623 | 1/2002 |
| JP | 2002-313139 | 10/2002 |
| JP | 2002 313572 | 10/2002 |
| WO | 99 02017 | 1/1999 |
| WO | 2004 057674 | 7/2004 |
| WO | 2005 041620 | 5/2005 |
| WO | 2005 053053 | 6/2005 |
| WO | WO 2006/013373 | 2/2006 |
| WO | 2007/096565 | 8/2007 |

OTHER PUBLICATIONS

U.S. Appl. No. 12/440,301, filed Mar. 6, 2009, Tchakarov, et al.

U.S. Appl. No. 12/527,723, filed Aug. 19, 2009, Tchakarov.

International Search Report as received in PCT/FR2007/052360 dated May 28, 2008.

European Search Report as received in corresponding Patent Application No. 11172743.4-1235 dated Sep. 23, 2011.

European Search Report as received in corresponding Patent Application No. 11172737.6-1235 dated Sep. 23, 2011.

European Search Report as received in corresponding Patent Application No. 11172746.7-1235 dated Sep. 23, 2011.

International Search Report issued Mar. 3, 2008 in PCT/FR2007/051876.

Kloeppel, A. et al., "Dependence of the electrical and optical behaviour of ITO-silver-ITO multilayers on the silver properties", Thin Solid Films, Elsevier, vol. 365, No. 1, pp. 139-146, (Apr. 1, 2000).

Jung, Yeon Sik et al., "Effects of thermal treatment on the electrical and optical properties of silver-based indium tin oxide / metal / indium tin oxide structures", Thin Solid Films, Elsevier, vol. 440, No. 1-2, pp. 278-284, (Sep. 1, 2003).

European Search Report as received in corresponding Patent Application No. 11185303.2-1235 dated Dec. 13, 2011.

Written Opinion of the International Searching Authority as received in International Application No. PCT/FR2008/052412, filed Dec. 23, 2008.

* cited by examiner

SUBSTRATE FOR AN ORGANIC LIGHT-EMITTING DEVICE, USE AND PROCESS FOR MANUFACTURING THIS SUBSTRATE, AND ORGANIC LIGHT-EMITTING DEVICE

CROSS-REFERENCE to RELATED APPILICATIONS

This application is a 371 of PCT/FR07/51876 filed Sep. 5, 2007 and claims the benefit of FR 0653617 filed Sep. 7, 2006 and FR 0654952 filed Nov. 17, 2006.

The subject of the present invention is a multilayer electrode, its acid etching and organic light-emitting devices incorporating it.

Known organic light-emitting systems or OLEDs comprise an organic electroluminescent material or a multilayer coating of organic electroluminescent materials supplied with electricity by electrodes generally in the form of two electroconductive layers flanking it.

These electroconductive layers commonly comprise a layer based on indium oxide, generally tin-doped indium oxide known more by the abbreviation ITO. ITO layers have been studied particularly closely. They can be easily deposited by magnetron sputtering, either using an oxide target (nonreactive sputtering) or using a target based on indium and tin (reactive sputtering in the presence of an oxidizing agent of the oxygen type), and their thickness is around 100 to 150 nm. However, this ITO layer has a number of drawbacks. Firstly, the material and the high-temperature (350° C.) deposition process for improving the conductivity generate additional costs. The sheet resistance remains relatively high (of the order of $10\Omega/\square$) unless the thickness of the layers is increased beyond 150 nm, which would result in a reduction in transparency and an increase in the surface roughness.

Thus, new electrode structures are being developed. For example, document JP2005-038642 teaches a TFT (thin-film transistor)-driven light-emitting flat screen comprising top-emitting electroluminescent systems generating, respectively, red light, green light and blue light, in order to form an active matrix.

Each organic light-emitting device is provided with what is called a rear or bottom electrode comprising:
  an adhesion layer, for example made of ITO;
  a (semi)reflective metallic layer, especially based on silver or aluminum, or made of silver containing aluminum, with a thickness of at least 50 nm; and
  a work-function-matching overlayer, for example made of ITO.

The object of the present invention is to be able to obtain an assembly of electroconductive layers in order to form a reliable electrode which is robust (especially in terms of stability and/or mechanical and thermal resistance) without sacrificing its electroconductivity properties or its optical quality, nor the performance of the device incorporating it, nor generating production difficulties.

The object of the invention is in particular to be able to obtain an assembly of electroconductive layers for forming the bottom electrode of a reliable robust electroluminescent system without sacrificing its electroconductivity properties, its optical quality, nor the optical performance of the OLED nor generating production difficulties.

The term "bottom electrode" should be understood within the context of the invention to mean the electrode inserted between the carrier substrate and the OLED system.

Additionally, this objective is to be achieved without upsetting the known configurations of organic light-emitting systems relating to the invention, and for a bottom cost.

This involves developing electrodes that are essentially transparent, or both transparent and reflective or essentially reflective, and which are suitable equally well for OLEDs forming active-matrix and passive-matrix OLED screens, or forming video screen backlighting devices or devices used in general (architectural and/or decorative) illumination applications or in indicating applications, or even for other electronic applications.

This novel electrode film may in particular have optical properties suitable for it to be used as faceplate, that is to say the face(s) via which the light produced by the OLED system leaves the device. In particular, it may have a sufficient light transmission combined with the lowest possible absorption. The reason for this is that it appears unnecessary to aim to have the highest possible light transmission in order to obtain the maximum light power at the exit of the OLED device, while on the hand, in the case of the faceplate, it is necessary to have the lowest possible absorption.

The present invention thus also consists in choosing a thin-film multilayer coating that is compatible with the process for fabricating the organic light-emitting device and in particular compatible with the step of forming the bottom electrode by etching before the OLED system is deposited.

The aim of the present invention is to remedy the drawbacks of the prior art by proposing a novel solution for the production of a bottom electrode film for an organic light-emitting device.

For this purpose, the subjects of the invention are: a substrate according to claim 1; the use of a substrate and especially the use of this substrate according to claim 22; an organic light-emitting device comprising this substrate or using this substrate according to claim 24; and a process for fabricating this substrate according to claim 29.

The claims dependent on the above claims define advantageous alternatives to the invention.

Thus, one subject of the invention, in its broadest sense, is a substrate for an organic light-emitting device, especially a transparent glass substrate, which includes, on a first main face, a bottom electrode film, the electrode film being formed from a thin-film multilayer coating comprising, in succession, at least:
  a contact layer based on a metal oxide and/or a metal nitride,
  a metallic functional layer having an intrinsic electrical conductivity property, and
  an overlayer based on metal oxide and/or on metal nitride, especially for matching the work function of said electrode film,
the substrate including a base layer, and said base layer covering said main face of the substrate.

The base layer according to the invention has two effects: it forms both a barrier to the alkali metals that could come from the substrate and an antireflection layer essential for the microcavity of the OLED system.

The electrode film according to the invention thus consists of a thin-film multilayer coating comprising at least one metallic functional layer, especially based on silver (i.e. made of silver or made of a metal alloy containing predominantly silver), and at least one bottom antireflection film placed between the substrate and this metallic functional layer, this antireflection film comprising at least one antireflection dielectric layer, namely the base layer.

The term "film" should be understood within the context of the present invention to mean that there may be a layer made of a single material, or several layers, each made of a different material.

The object of this antireflection film beneath the metallic functional layer facing the substrate and in contact with the substrate is to make the radiation emitted by the OLED system barely wavelength-selective and barely dependent on the viewing angle.

This is because, in the absence of this antireflection film, on the one hand, the light emitted by the OLED system is very concentrated on the emission wavelength or the very narrow range of emission wavelengths of the OLED system and on the other hand the color and the power of this light vary greatly with the viewing angle.

This type of thin-film multilayer coating is known in the field of architectural or automotive glazing for producing enhanced thermal insulation glazing of the "low-emissivity or low-E" and/or "solar control" type.

The inventors thus noticed that certain multilayer coatings used for low-E glazing in particular could be used for producing the base layer and the electrode film for organic light-emitting devices and especially the base layer and the electrode film for the faceplate(s) of these devices.

The multilayer coatings known as "toughenable" multilayer coatings or coatings "to be toughened", that is to say those used when it is desired to make the substrate bearing the multilayer coating undergo a toughening heat treatment, are in particular suitable. This is all the more surprising since the substrate for an organic light-emitting device has not undergone a heat treatment for its implementation in this device, or in any case no sufficiently hot heat treatment with sufficiently rapid cooling in order to carry out a toughening treatment on the glass substrate.

Thus, the subject of the invention is also the use of a thin-film multilayer coating for architectural glazing or the use of a substrate coated with a thin-film multilayer coating for architectural glazing, especially a low-E multilayer coating or coated substrate and/or especially a "toughenable" multilayer coating or coated substrate or one "to be toughened", in order to produce a substrate according to the invention for an organic light-emitting device.

The term "toughenable" multilayer coating or substrate should be understood within the context of the present invention to mean that the essential optical properties and thermal properties (expressed by the resistance per square, which is directly related to the emissivity) are preserved during the heat treatment.

Thus, it is possible on one and the same building façade for example to place glazing panels close together that incorporate toughened substrates and untoughened substrates, both coated with the same multilayer coating, without it being possible to distinguish one from another by simple visual observation of the color in reflection and/or of the light reflection/transmission.

For example, a multilayer coating or a substrate coated with a multilayer coating, having the following changes before 0 after heat treatment, will be considered to be toughenable since these changes will not be perceptible to the eye:
  a small change in light transmission $\Delta T_L$ of less than 3%, or even less than 2%; and/or
  a small change in light reflection $\Delta R_L$ of less than 3%, or even less than 2%; and/or
  a small change in color $\Delta E = \sqrt{((\Delta L^*)^2 + (\Delta a^*)^2 + (\Delta b^*)^2)}$ of less than 3 or even less than 2.

A multilayer coating or substrate "to be toughened" should be understood within the present invention to mean that the optical and thermal properties of the coated substrate are acceptable after heat treatment, whereas they were not, or in any case were not all, previously.

For example, a multilayer coating or a substrate coated with a multilayer coating, having the following characteristics after the heat treatment, will be considered "to be toughened" within the context of the present invention, whereas prior to the heat treatment at least one of these characteristics was not fulfilled:
  a high light transmission $T_L$ of at least 50%, or even at least 60% or 65%, or even 70%, or even at least 75% and more preferably at least 80%; and/or
  a resistance per square R at least as good as that of the ITO with the usual thicknesses, and in particular less than 20Ω/□ or even less than 15Ω/□.

The important point is that the electrode film used for the faceplate is either sufficiently transparent such that prior to the deposition of the OLED system, it has a light transmission of at least 50% and preferably between 60 and 70% and has, on the other hand, a very low absorbance, such that prior to the deposition of the OLED system, it has an absorption defined as being $1-R_L-T_L$ equal to or less than 15%, or even equal to or less than 10%, or even equal to or less than 8% or even equal to or less than 5%.

A light transmission greater than 70% is to be avoided if this means that, to obtain this value, the thickness of the thin-film coating located between the metallic functional layer and the OLED system (overlayer and optional other layer(s)) has too great a thickness liable to impair the performance of the OLED by the metallic functional layer being too far away from the OLED system.

The base layer may be:
  based on silicon oxide (of general formula SiO);
  based on silicon oxycarbide (of general formula SiOC);
  based on silicon nitride (of general formula SiN), and in particular based on $Si_3N_4$;
  based on silicon oxynitride (of general formula SiON);
  based on silicon oxycarbonitride (of general formula SiONC).

It is possible for the nitriding of the base layer to be slightly substoichiometric.

Preferably, the base layer has a thickness of between 10 and 150 nm, even more preferably between 20 and 100 nm.

The base layer gives the electrode according to the invention many advantages. Firstly, it is a barrier to the alkali metals below the electrode. It protects the superjacent contact layer from any contamination (which contaminations could induce mechanical defects, such as delaminations) and it also maintains the electrical conductivity of the metallic functional layer. It also prevents the organic structure of an OLED device from being contaminated by the alkali metals but as a result considerably reducing the life of the OLED.

The migration of alkali metals may occur during the fabrication of the device, resulting in a lack of reliability, and/or afterwards, reducing its lifetime.

The base layer improves the anchoring properties of the contact layer without appreciably increasing the roughness of the entire multilayer coating, even if one or more layers are interposed between the base layer and the contact layer.

Of course, the invention is most particularly beneficial for an electrode lying as close as possible to the carrier substrate liable to discharge alkali metals, such as especially clear or extra-clear soda-lime silica glass.

Moreover, this particular multilayer coating structure also makes it possible to obtain a reliable electrode, enabling significant productivity gains to be achieved.

Furthermore, what is obtained, at a lower cost, is an electrode exhibiting compatibility of the surface properties with the organic light-emitting systems while still having electrical conductivity and/or transparency or reflectivity properties which can, where appropriate, be adjusted, especially by varying the thickness of the metallic layer or of the other layers and/or the deposition conditions.

For a given organic structure of an OLED device, the electrode of the invention enables the efficiency in lm/W of the OLED to be improved by 5 to 10%, and up to 15 or even 20%, for a brightness greater than 500 cd/m² compared with an ITO electrode of the usual thickness.

The electrode film may preferably include an etch stop layer between the base layer and the contact layer especially a layer based on tin oxide, this etch stop layer having in particular a thickness of between 10 and 100 nm and even more preferably between 20 and 60 nm.

Most particularly, for the sake of simplicity, the etch stop layer may form part of or be the base layer: preferably, it may be based on silicon nitride or may be a layer which is based on silicon oxide or based on silicon oxynitride or based on silicon oxycarbide or even based on silicon oxycarbonitride and with tin for reinforcing by anti-etching property, a layer of general formula SnSiOCN.

The etch stop layer serves to protect the substrate in the case of chemical etching or reactive plasma etching.

Thanks to the etch stop layer, the base layer remains present even in the patterned zones. Thus, the migration of alkali metals, by the edge effect, between the substrate in a patterned zone and an adjacent electrode part (or even an organic structure), may be stopped.

Most particularly preferable is a base layer/etch stop layer made (essentially) of doped or undoped silicon nitride $Si_3N_4$. Silicon nitride is very rapidly deposited and forms an excellent alkali metal barrier. Furthermore, thanks to its high optical index relative to the carrier substrate, it allows the optical properties of the electrode to be adapted, preferably by varying the thickness of this base layer/etch stop layer. Thus, in this way it is possible to adjust for example the color in transmission when the electrode is transparent or in reflection when the opposite face from the carrier substrate is a mirror.

Preferably, the functional layer is based on a pure material chosen from: silver, gold, aluminum and copper or based on said material alloyed or doped with another material chosen from: Ag, Au, Pd, Al, Pt, Cu, Zn, Cd, In, Si, Zr, Mo, Ni, Cr, Mg, Mn, Co and Sn, and especially is based on a gold/silver alloy or on a gold/copper alloy.

The thin-film coating forming the electrode film is preferably a functional monolayer film, that is to say a single functional layer. However, it may be a coating comprising several functional layers and especially two functional layers.

To produce an electrode film comprising several functional layers deposited n times on the base layer and an optional etch stop layer, where n is an integer equal to or greater than 1, is the following structure: the contact layer and the functional metallic layer, the structure being surmounted by a sequence comprising the succession consisting at least of: contact layer/functional metallic layer/overlayer.

The electrode according to the invention may have a large area, for example an area equal to or greater than 0.02 m² or even equal to or greater than 0.5 m² or equal to or greater than 1 m².

Advantageously, the electrode according to the invention may have:
- a resistance per square equal to or less than 10Ω/□ for a functional layer thickness of 6 nm upward, preferably equal to or less than 5Ω/□ for a functional layer thickness of 10 nm and upward, preferably combined with the following optical properties:
  a light transmission $T_L$ equal to or greater than 50% and preferably between 60% and 70%, or even higher if this does not impair the luminous performance of the OLED and
  an absorption equal or to or less than 15%, or equal to or less than 10% or even more preferably equal to or less than 8%, or even 5%,
  thereby making its use as a transparent electrode particularly satisfactory,
- a resistance per square equal to or less than 10Ω/□ for a functional layer thickness of 50 nm and upward, preferably equal to or less than 0.6Ω/□, preferably combined with a light transmission $R_L$ equal to or greater than 70%, even more preferably 80%, thereby making its use as a reflective electrode particularly satisfactory,
- a resistance per square equal to or less than 3Ω/□ for a functional layer thickness of 20 nm and upward, preferably equal to or less than 1.8Ω/□, preferably combined with a $T_L/R_L$ ratio of between 0.1 and 0.7, thereby making its use as a transparent/reflective electrode particularly satisfactory.

The thickness of the silver-based metallic functional layer (or all of these layers) chosen may be, for an electrode, between 3 and 20 nm (in total), preferably between 5 and 15 nm. In this thickness range, the electrode may be sufficiently transparent, thanks to the antireflection film subjacent to the (or each) silver-based metallic functional layer, to enable a particularly satisfactory transparent electrode to be produced, as mentioned in the preceding paragraph.

However, it is not expedient to have a chosen silver-based metallic functional layer (or all these layers) with a markedly greater thickness, especially if the organic light-emitting system operates in reflection or is top-emitting. The thickness of the chosen silver-based functional layer (or all these layers) in this case for an electrode can be between 50 and 150 nm (in total), preferably between 80 and 100 nm, so as to enable a particularly satisfactory reflective electrode to be produced, as mentioned above.

The thickness of the chosen silver-based functional layer (or all these layers) may furthermore be for an electrode between 20 and 50 nm (in total) in order for the electrode to operate both in transmission and in reflection so as to enable a particularly satisfactory transparent/reflective electrode to be produced, as mentioned above.

The (or each) metallic, especially silver-based, functional layer is preferably deposited in a crystalline form on a thin dielectric layer which is also preferably crystalline. The contact layer thus promotes the suitable crystalline orientation of the metallic layer deposited above.

Thus, the functional layer is preferably deposited above, and even directly on, an oxide-based contact layer, especially one based on zinc oxide, optionally doped, optionally doped with aluminum (the term "doped" is understood in the usual manner to mean being exposed to the presence of the element in an amount of less than 10% by weight of metallic element in the layer and the expression "based on" is understood in the usual manner to mean a layer containing predominantly the material, i.e. containing at least 50% of this material by weight—the expression "based on" thus covers doping).

The geometric (or actual) thickness of the contact layer is preferably between 3 and 30 nm and more preferably between 4 and 20 nm.

The effect of the contact layer in the antireflection film beneath the metallic functional layer may sometimes be neglected, especially when the index of this layer is close to that of the substrate and/or when this layer has a small thickness, typically when this is less than 10 nm.

The contact layer may be based on a metal nitride and may then be coincident with the base layer, in particular when the base layer is based on silicon nitride.

Preferably, the contact layer is based on at least one of the following metal oxides, which is optionally doped: chromium oxide, indium oxide, optionally substoichiometric zinc oxide, aluminum oxide, titanium oxide, molybdenum oxide, zirconium oxide, antimony oxide, tin oxide, tantalum oxide and silicon oxide (for simplification, silicon is considered here as a metal).

Typically, the metal oxide may be doped between 0.5 and 5%. In particular, it may be Al-doped zinc oxide (AZO), Ga-doped zinc oxide (GZO), or even B-doped, Sc-doped or Sb-doped zinc oxide for better stability of the deposition process, or even F-doped or S-doped tin oxide.

The contact layer may be based on a mixed oxide, especially generally nonstoichiometric mixed tin zinc oxide $Sn_xZn_yO_z$ as an amorphous phase, or based on a mixed indium tin oxide (ITO) or a mixed indium zinc oxide (IZO).

A layer of zinc oxide $ZnO_x$, preferably with x less than 1 and even more preferably between 0.88 and 0.98, especially between 0.90 and 0.95, is preferred. This layer may be a pure layer or one doped with Al or with Ga.

The stack is generally obtained by a succession of deposition operations carried out by a vacuum technique, such as sputtering, optionally magnetron sputtering. It is also possible to provide one or even two very thin films called "blocking films" deposited directly beneath, on, or on each side of each metallic functional layer, especially based on silver, the film subjacent to the functional layer, in the direction of the substrate, as bonding, nucleating and/or protective film, and the film superjacent to the functional layer as protective or "sacrificial" film so as to prevent impairment of the metallic functional layer by attack and/or migration of oxygen from a layer that surmounts it, or also by migration of oxygen if the layer that surmounts it is deposited by sputtering in the presence of oxygen.

The functional metallic layer may thus be placed directly on at least one subjacent blocking film and/or directly beneath at least one superjacent blocking film, each film having a thickness preferably between 0.5 and 5 nm.

Within the context of the present invention, when it is specified that a deposit of a layer or film (comprising one or more layers) is formed directly beneath or directly on another deposit, there may be no interposition of any layer between these two deposits.

At least one blocking film preferably comprises a metallic, metal nitride and/or metal oxide layer, based on at least one of the following metals: Ti, V, Mn, Fe, Co, Cu, Zn, Zr, Hf, Al, Nb, Ni, Cr, Mo, Ta, W, or based on an alloy of at least one of said materials.

For example, a blocking film may consist of a layer based on niobium, tantalum, titanium, chromium or nickel or on an alloy formed of at least two of said metals, such as a nickel-chromium alloy.

A thin blocking layer forms a protective or even a "sacrificial" layer, which prevents impairment of the metal of the functional metallic layer, especially in one or more of the following configurations:

- if the layer that surmounts the functional layer is deposited using a reactive (oxygen, nitrogen, etc.) plasma, for example if the oxide layer that surmounts it is deposited by sputtering;
- if the composition of the layer that surmounts the functional layer is liable to vary during industrial fabrication (variation in the deposition conditions, of the target wear type, etc.), especially if the stoichiometry of an oxide and/or nitride type layer varies, therefore modifying the quality of the functional layer and therefore the properties (surface resistance, light transmission, etc.) of the electrode; and
- if the electrode coating undergoes a heat treatment after deposition.

This protective or sacrificial layer significantly improves the reproducibility of the electrical and optical properties of the electrode. This is very important for an industrial approach in which only a small scatter in the properties of the electrodes is acceptable.

A thin blocking layer based on a metal chosen from niobium Nb, tantalum Ta, titanium Ti, chromium Cr and nickel Ni, or based on an alloy formed from at least two of these metals, especially a niobium/tantalum (Nb/Ta) alloy, a niobium/chromium (Nb/Cr) alloy or a tantalum/chromium (Ta/Cr) alloy or a nickel/chromium (Ni/Cr) alloy, is particularly preferred. This type of layer based on at least one metal has a particularly strong gettering effect.

A thin metallic blocking layer may be easily fabricated without impairing the functional layer. This metallic layer may preferably be deposited in an inert atmosphere (i.e. into which no oxygen or nitrogen has been intentionally introduced), consisting of a noble gas (He, Ne, Xe, Ar, Kr). It is neither excluded nor is it problematic for this metallic layer to be oxidized on the surface during subsequent deposition of a layer based on a metal oxide.

Such a thin metallic blocking layer also provides excellent mechanical behavior (especially abrasion and scratch resistance). This is especially so for multilayer coatings that undergo a heat treatment, and therefore a substantial diffusion of oxygen or nitrogen during this treatment.

However, for the use of a metallic blocking layer it is necessary to limit the thickness of the metallic layer and therefore the light absorption in order to retain sufficient light transmission for the transparent electrodes.

The thin blocking layer may be partially oxidized. This layer is deposited in nonmetallic form and is therefore not deposited in stoichiometric form but in substoichiometric form, of the $MO_x$ type, where M represents the metal and x is a number bottom than that for stoichiometry of the oxide of the metal, or of the $MNO_x$ type for an oxide of two metals M and N (or of more than two). For example, mention may be made of $TiO_x$ and $NiCrO_x$.

Preferably, x is between 0.75 times and 0.99 times the normal number for stoichiometry of the oxide. For a monoxide, x may in particular be chosen to be between 0.5 and 0.98 and for a dioxide x may be between 1.5 and 1.98.

In one particular variant, the thin blocking layer is based on $TiO_x$ in which x may in particular be such that $1.5 \leq x \leq 1.98$ or $1.5 < x < 1.7$, or even $1.7 \leq x \leq 1.95$.

The thin blocking layer may be partially nitrided. It is therefore not deposited in stoichiometric form but in substoichiometric form of the type $MN_y$, where M represents the material and y is a number smaller than that for stoichiometry of the nitride of the material. y being preferably between 0.75 times and 0.99 times the number for normal stoichiometry of the nitride.

Likewise, the thin blocking layer may also be partially oxynitrided.

This thin oxidized and/or nitrided blocking layer may be readily fabricated without impairing the functional layer. It is preferably deposited using a ceramic target in a non-oxidizing atmosphere consisting preferably of a noble gas (He, Ne, Xe, Ar or Kr).

The thin blocking layer may preferably be made of a substoichiometric nitride and/or oxide in order to further increase the reproducibility of the electrical and optical properties of the electrode.

The chosen thin substoichiometric oxide and/or nitride blocking layer may preferably be based on a metal chosen from at least one of the following metals: Ti, V, Mn, Fe, Co, Cu, Zn, Zr, Hf, Al, Nb, Ni, Cr, Mo, Ta, W, or on an oxide of a substoichiometric alloy based on at least one of these metals.

Particularly preferred is a layer based on an oxide or oxynitride of a metal chosen from niobium Nb, tantalum Ta, titanium Ti, chromium Cr or nickel Ni or on an alloy formed from at least two of these metals, especially a niobium/tantalum (Nb/Ta) alloy, a niobium/chromium (Nb/Cr) alloy, a tantalum/chromium (Ta/Cr) alloy or a nickel/chromium (Ni/Cr) alloy.

As substoichiometric metal nitride, it is also possible to choose a layer made of silicon nitride $SiN_x$ or aluminum $AlN_x$ or chromium nitride $CrN_x$ or titanium nitride $TiN_x$ or a nitride of several metals, such as $NiCrN_x$.

The thin blocking layer may have an oxidation gradient, for example $M(N)O_{xi}$, with xi varying, that part of the blocking layer in contact with the functional layer being less oxidized than that part of this layer furthest away from the functional layer, using a particular deposition atmosphere.

The blocking film may also be a multilayer and in particular comprise:
- on the one hand, an "interfacial" layer immediately in contact with said functional layer, this interfacial layer being made of a material based on a non-stoichiometric metal oxide, nitride or oxynitride, such as those mentioned above;
- on the other hand, at least one layer made of a metallic material, such as those mentioned above, this layer being immediately in contact with said "interfacial" layer.

The interfacial layer may be an oxide, nitride or oxynitride of a metal or metals, present in the optional adjacent metallic layer.

The overlayer of the electrode film according to the invention is preferably based on at least one of the following, optionally doped, metal oxides: chromium oxide, indium oxide, optionally substoichiometric zinc oxide, aluminum oxide, titanium oxide, molybdenum oxide, zirconium oxide, antimony oxide, tin oxide, tantalum oxide and silicon oxide, and this overlayer preferably has a thickness of between 3 and 50 nm.

This overlayer may be for example a tin oxide doped with F, Sb, or an aluminum-doped zinc oxide, or optionally be based on a mixed oxide, especially a mixed indium tin oxide, a mixed indium zinc oxide or a mixed zinc tin oxide.

The substrate according to the invention coated with the base layer and with the electrode film preferably has a low roughness such that the peak-to-valley distance on the overlayer is equal to or less than 10 nm.

The substrate according to the invention coated with the base layer and with the electrode film preferably has, on the overlayer, an RMS roughness of 3 nm or less, preferably even 2 nm or less and even more preferably 1.5 nm or less or 1 nm or less, so as to avoid spike defects which would drastically reduce the lifetime and the reliability in particular of the OLED.

The RMS roughness denotes the root mean square roughness. This is a measure of the RMS deviation of the roughness. This RMS roughness therefore specifically quantifies on average the height of the peaks and troughs of the roughness relative to the average height. Thus, an RMS roughness of 2 nm means a double peak average amplitude.

It may be measured in various ways: for example, by atomic force microscopy, by a mechanical stylus system (using for example the measurement instruments sold by VEECO under the name DEKTAK) and by optical interferometry. The measurement is generally performed over an area of one square micron by atomic force microscopy and over a larger area, of around 50 microns by 2 millimeters, by mechanical stylus systems.

This low roughness is in particular achieved when the substrate comprises, between the base layer and the contact layer, a non-crystalline smoothing layer made of a mixed oxide, said smoothing layer being placed immediately beneath said contact layer and being made of a material other than that of the contact layer.

Preferably, the smoothing layer is a mixed oxide layer based on an oxide of one or more of the following metals: Sn, Si, Ti, Zr, Hf, Zn, Ga and In, and especially is an optionally doped mixed oxide layer based on zinc and tin or a mixed indium tin oxide (ITO) layer or a mixed indium zinc oxide (IZO) layer.

Preferably, the smoothing layer has a geometric thickness between 0.1 and 30 nm and more preferably between 0.2 and 10 nm.

However, the substrate preferably includes a bottom bus electrode structure above the bottom electrode film, said bus electrode structure being in electrical contact with said electrode film.

The bottom bus electrode structure takes the form of a current supply layer before the etching. Preferably, it has a thickness of between 0.5 and 10 µm and preferably takes the form of a monolayer of one of the following metals: Mo, Al, Cr, Nd or an alloy such as MoCr, AlNd or in the form of a multilayer such as MoCr/Al/MoCr.

For production of an OLED device, the substrate comprises, in the following order, starting from the first main face of the substrate:
- an OLED system above the bottom electrode film;
- a top electrode film above said OLED system; and
- a top bus electrode structure above the top electrode film, said bus electrode structure being in electrical contact with said top electrode film.

In one particular embodiment, the assembly formed by the base layer and the bottom electrode film consists of a multilayer coating for architectural glazing, especially a "toughenable" multilayer coating or one "to be toughened" and/or especially a low-E multilayer coating, in particular a multilayer coating of the following type:
- base layer based on a metal oxide and/or based on a metal nitride/(etch stop layer)/(smoothing layer)/oxide contact layer/(underblocker film)/metallic functional layer/ (overblocker film)/overlayer based on a metal oxide and/ or a metal nitride;
- base and contact layer based on a metal nitride/(underblocker film)/metallic functional layer/(overblocker film)/overlayer based on a metal nitride.

In another particular embodiment, the substrate coated with the base layer and with the bottom electrode film consists of a substrate for architectural glazing, especially "toughenable" architecture glazing or architectural glazing "to be toughened", which is coated with a thin-film multilayer coating and/or in particular a low-E multilayer coating, said substrate preferably not being toughened after deposition of the thin layers.

In an additional embodiment, the substrate according to the invention includes, on a second main face, a functional film chosen from: an antireflection multilayer; an antifogging or antifouling layer; an ultraviolet filter, especially a titanium oxide layer; a phosphor layer; a mirror layer; and a light extraction scattering zone.

The flat substrate may be transparent (in particular for emission through the substrate). The flat substrate may be rigid, flexible or semiflexible.

The flat substrate is preferably made of glass, especially a soda-lime silica glass. Advantageously, the substrate may be a glass having an absorption coefficient of less than 2.5 $m^{-1}$, preferably less than 0.7 $m^{-1}$, at the wavelength of the OLED radiation.

For example, soda-lime silica glasses with less than 0.05% Fe III or $Fe_2O_3$ are chosen, especially the glass Diamant from Saint-Gobain Glass, the glass Optiwhite from Pilkington or the glass B270 from Schott. All the extra-clear glass compositions described in document WO 04/025334 may be chosen.

In a chosen configuration for emission of the OLED system through the thickness of the transparent substrate, some of the radiation emitted is guided in the substrate.

In addition, in an advantageous design of the invention, the thickness of the chosen glass substrate may be at least 1 mm, for example preferably at least 5 mm. This allows the number of internal reflections to be reduced and thus enables more of the radiation guided in the glass to be extracted, thereby increasing the brightness of the luminous zone.

The edge of the substrate may also be reflected and preferably have a mirror, for optimum recycling of the guided radiation, and/or this edge may make with the main face associated with the OLED system an internal angle greater than 90° but less than or equal to 135°, preferably around 100°, in order to redirect the radiation over a wider extraction area. The edge of the substrate may thus be beveled.

For electrically separating the electrodes in document JP 2005-038642, the bottom electrode is structured in several etching steps involving various acids and at various etching rates. Thus, the work-function-matching layer is firstly etched, then the metallic layer and finally the adhesion layer.

One object of the invention is to be able to obtain an assembly of electroconductive layers in order to form a reliable electrode which is robust (especially in terms of stability and/or thermal and mechanical resistance) without sacrificing its electroconductivity properties, its optical quality, nor the performance of the device incorporating it, nor causing production difficulties, especially for wet etching.

The invention thus provides a process for the acid etching of a multilayer electrode on a substrate, especially a glass substrate, which includes a base layer, preferably based on silicon nitride, silicon oxide or silicon oxynitride.

The invention also relates to the process for fabricating the substrate according to the invention, in which at least the base layer and the electrode film are deposited on the substrate, preferably at least partly by a vacuum technique of the sputtering type, optionally magnetron sputtering, and then the substrate undergoes etching, to etch at least the electrode film in a single step.

All the layers of the electrode film are preferably deposited by a vacuum deposition technique, however it is not excluded for the first layer or layers of the multilayer coating to be able to be deposited by another technique, for example a pyrolysis-type thermal decomposition technique.

Within the context of the process for fabricating the device, if the electrode film does not have the necessary electrode structure directly, it undergoes an etching step for the purpose of producing an electrode structure, such as for example a chemical (preferably acid) screen-printing step or a laser etching step, such as those steps already known in its principle for the ITO-based electrode films.

The electrode film according to the invention may most particularly be etchable by RIE (reactive ion etching) or else more preferably by wet etching (a process that can be easily integrated into the fabrication phase and at atmospheric pressure).

All of the layers, from the contact layer to the overlayer, including the functional layer, are preferably etched in the same etching pattern and preferably by a single etching operation, that is to say the base layer itself is not etched. The etch stop layer, if it is present, is preferably also intact, but may be slightly etched, for example over one tenth of its initial thickness. The same applies for the base layer if the etch stop layer is not present.

Furthermore, it is generally preferable to provide the electrode film with a bus electrode before deposition of the OLED system. The layer that will form the bus electrodes is preferably etched at the same time as the electrode film.

Thus, the invention provides a process for the acid etching of a multilayer electrode on a substrate, especially a glass substrate, which includes an acid etch stop layer, preferably one based on silicon nitride and/or silicon oxide, the etching being carried out in a single step and with a single acid solution chosen from pure nitric acid $HNO_3$ or nitric acid mixed with hydrochloric acid HCl, or pure hydrochloric acid or hydrochloric acid mixed with iron trichloride $FeCl_3$, otherwise called Fe III chloride.

Thus, etching patterns may be etched in which the width and the spacing vary depending on the applications.

The etching may be carried out in the presence of at least one metal current supply strip preferably in the form of a monolayer based on one of the following metals: Mo, Al, Cr, Nd or an alloy such as MoCr, AlNd, or based on a multilayer such as MoCr/Al/MoCr.

The invention also relates to an organic light-emitting device comprising at least one carrier substrate, especially a glass substrate, provided with at least one organic electroluminescent layer placed between the bottom electrode as described above, namely the one closest to the carrier substrate, and a top electrode.

The OLED device may produce monochromatic, especially blue and/or green and/or red, light or may be adapted so as to produce white light.

To produce white light, several methods are possible: mixing of compounds (red, green, blue emission) in a single layer; stacking on the face of the electrodes of three organic structures (red, green and blue emission) or two organic structures (yellow and blue); series of three adjacent organic structures (red, green, blue emission); on the face of the electrodes, one organic structure in one color and on the other face suitable phosphor layers.

The OLED device may comprise a plurality of adjacent organic light-emitting systems, each emitting white light, or by a series of three, emitting red, green and blue light, the systems being for example connected in series.

The device may form part of a multiple glazing unit, especially a vacuum glazing unit or one with an air layer or layer of another gas. The device may also be monolithic and comprise a monolithic glazing unit in order to be more compact and/or lighter.

The OLED system may be bonded to, or preferably laminated with another flat substrate, called a cover, preferably transparent, such as a glass, using a laminating interlayer, especially an extra-clear interlayer.

The laminated glazing units usually consist of two rigid substrates between which a thermoplastic polymer sheet or superposition of such sheets is placed. The invention also includes what are called "asymmetric" laminated glazing units using in particular a rigid carrier substrate of the glass type and, as a covering substrate, one or more protective polymer sheets.

The invention also includes laminated glazing units having at least one interlayer sheet based on a single-sided or double-sided adhesive polymer of the elastomer type (i.e. one not requiring a lamination operation in the conventional meaning of the term, i.e. lamination requiring heating generally under pressure so as to soften the thermoplastic interlayer sheet and make it adhere).

In this configuration, the means for fastening the cover to the carrier substrate may then be a lamination interlayer, especially a sheet of thermoplastic, for example polyurethane (PU), polyvinyl butyral (PVB) or ethylene/vinyl acetate (EVA), or a thermally curable single-component or multi-component resin (epoxy, PU) or ultraviolet-curable single-component or multi-component resin (epoxy, acrylic resin). Preferably, a sheet has (substantially) the same dimensions as the cover and the substrate.

The lamination interlayer may prevent the cover from flexing, especially for large devices, for example with an area greater than 0.5 m$^2$.

In particular, EVA offers many advantages:
it contains little or no water by volume;
it does not necessarily require high pressure for processing it.

A thermoplastic lamination interlayer may be preferred to a cover made of cast resin as it is both easier to implement and more economical and is possibly more impervious.

The interlayer optionally includes an array of electroconductive wires set into its internal surface, facing the top electrode, and/or an electroconductive layer or electroconductive strips on the internal surface of the cover.

The OLED system may preferably be placed inside the double glazing unit, with a gas layer such as an inert gas (for example argon).

The top electrode may be an electroconductive layer advantageously chosen from metal oxides, especially the following materials:
doped zinc oxide, especially aluminum-doped zinc oxide ZnO:Al or gallium-doped zinc oxide ZnO:Ga;
or doped indium oxide, especially tin-doped indium oxide (ITO) or zinc-doped indium oxide (IZO).

More generally, it is possible to use any type of transparent electroconductive layer, for example a TCO (transparent conductive oxide) layer, for example with a thickness between 20 and 1000 nm.

It is also possible to use a thin metallic layer called a TCC (transparent conductive coating) for example made of Ag, Al, Pd, Cu, Pd, Pt In, Mo, Au and typically having a thickness of between 5 and 150 nm depending on the desired light transmission/reflection.

The electrode is not necessarily continuous. The top electrode may comprise a plurality of conducting strips or conducting wires (mesh).

Furthermore, it may be advantageous to add a film having a given functionality on the opposite face from the substrate bearing the electrode according to the invention or on an additional substrate. This may be an anti-fogging layer (using a hydrophilic layer), an anti-fouling layer (a photocatalytic coating comprising $TiO_2$, at least partly crystallized in anatase form), or else an anti-reflection multilayer coating for example of the $Si_3N_4/SiO_2/Si_3N_4/SiO_2$ type, or else a UV filter such as, for example, a layer of titanium oxide ($TiO_2$). It may also be one or more phosphor layers, a mirror layer or at least one scattering light extraction zone.

The invention also relates to the various applications to which these OLED devices may be put, said devices forming one or more luminous surfaces, which are transparent and/or reflecting (mirror function), placed both for outdoor and indoor applications.

The device may form, alternatively or in combination, an illuminating, decorative, architectural etc. system, or an indicating display panel—for example of the drawing, logo or alpha-numeric indication type, especially an emergency exit panel.

The OLED device may be arranged to produce uniform light, especially for homogeneous illumination, or to produce various luminous zones, of the same intensity or of different intensity.

Conversely, differentiated illumination may be sought. The organic light-emitting system (OLED) produces a direct light zone, and another luminous zone is obtained by extraction of the OLED radiation that is guided by total reflection in the thickness of the substrate, which is chosen to be made of glass.

To form this other luminous zone, the extraction zone may be adjacent to the OLED system or on the other side from the substrate. The extraction zone or zones may serve for example to increase the illumination provided by the direct light zone, especially for architectural illumination, or else for indicating the luminous panel. The extraction zone or zones are preferably in the form of one or more, especially uniform, bands of light and these preferably being placed on the periphery of one of the faces. These bands may for example form a highly luminous frame.

Extraction is achieved by at least one of the following means placed in the extraction zone: a diffusing layer, preferably based on mineral particles and preferably with a mineral binder, the substrate made to be diffusing, especially a textured or rough substrate.

The two main faces may each have a direct light zone.

When the electrodes and the organic structure of the OLED system are chosen to be transparent, an illuminating window may in particular be produced. Improvement in illumination of the room is then not to the detriment of light transmission. By also limiting the light reflection, especially on the external side of the illuminating window, it is also possible to control the level of reflection, for example so as to meet the anti-dazzling standards in force for the walls of buildings.

More broadly, the device, especially a partly or entirely transparent device, may be:
intended for buildings, such as exterior luminous glazing, an internal luminous partition or a luminous glazed door (or part of a door), especially a sliding one;
intended for a transport vehicle, such as a luminous roof, a luminous side window (or part of a window), an internal luminous partition of a terrestrial, water-borne or air-borne vehicle (automobile, truck, airplane, boat, etc.);

intended for urban or professional furniture, such as a bus shelter panel, a wall of a display counter, a jewelry display or a shop window, a greenhouse wall, or an illuminating tile;

intended for interior furnishings, a shelf or cabinet element, a façade of a cabinet, an illuminating tile, a ceiling, an illuminating refrigerator shelf, an aquarium wall;

intended for the backlighting of electronic equipment, especially a display screen, optionally a double screen, such as a television or computer screen, a touch-sensitive screen.

For example, it is possible to envisage backlighting for a double-sided screen with various sizes, a small screen preferably being associated with a Fresnel lens to concentrate the light.

To form an illuminating mirror, one of the electrodes may be reflecting, or a mirror may be placed on the opposite face to the OLED system, if preferential lighting on only one side in the direct light zone is desired.

It may also be a mirror. The luminous panel may serve for illuminating a bathroom wall or a kitchen worktop, or may be a ceiling.

The OLEDs are generally divided into two broad families depending on the organic material used.

If the electroluminescent layers are formed from small molecules, the devices are referred to as SM-OLED (Small-Molecule Organic Light-Emitting Diodes). The organic electroluminescent material of the thin layer consists of evaporated molecules, such as for example those of the complex AlQ$_3$ (tris(8-hydroxyquinoline)aluminum), DPVBi (4,4'-(diphenylvinylene)biphenyl), DMQA (dimethyl quinacridone) or DCM (4-(dicyanomethylene)-2-methyl-6-(4-dimethylaminostyryl)-4H-pyran). The emissive layer may also for example be a layer of 4,4',4"-tri(N-carbazolyl)triphenylamine (TCTA) doped with fac-tris(2-phenylpyridine)iridium (Ir(ppy)$_3$).

In general, the structure of an SM-OLED consists of a stack of an HIL (hole injection layer) and a hole transporting layer (HTL), an emissive layer and an ETL (electron transporting layer).

An example of a hole injection layer is copper phthalocyanine (CuPC) and the hole transporting layer may for example be N,N'-bis(naphth-1-yl)-N,N'-bis(phenyl)benzidine (alpha-NPB).

The electron transporting layer may be composed of tris-(8-hydroxyquinoline)aluminum (AlQ$_3$) or bathophenanthroline (BPhen).

The top electrode may be an Mg/Al or LiF/Al layer.

Examples of organic light-emitting stacks are for example described in document U.S. Pat. No. 6,645,645.

If the organic electroluminescent layers are polymers, the devices are referred to as PLEDs (polymer light-emitting diodes).

The organic electroluminescent material of the thin layer consists of polymers (PLEDs) such as for example PPV standing for poly(para-phenylenevinylene), PPP (poly(para-phenylene)), DO-PPP (poly(2-decyloxy-1,4-phenylene)), MEH-PPV (poly[2-(2'-ethylhexyloxy)-5-methoxy-1,4-phenylenevinylene]), CN-PPV (poly[2,5-bis(hexyloxy)-1,4-phenylene-(1-cyanovinylene)]) or PDAFs (polydialkylfluorenes), and the polymer layer is also associated with a layer that promotes hole injection (an HIL) consisting for example of PEDT/PSS (poly(3,4-ethylene-dioxythiophene)/poly(4-styrene sulphonate)).

One example of a PLED consists of the following stack:

a layer of poly(2,4-ethylene dioxythiophene) doped with poly(styrene sulphonate) (PEDOT:PSS) with a thickness of 50 nm; and a layer of phenyl poly(p-phenylenevinylene) Ph-PPV with a thickness of 50 nm.

The top electrode may be a layer of Ca.

The invention will now be described in greater detail by means of nonlimiting examples and figures.

It should be pointed out that for the sake of clarity the various elements of the objects (including the angles) shown have not necessarily been drawn to scale.

Figure 1:
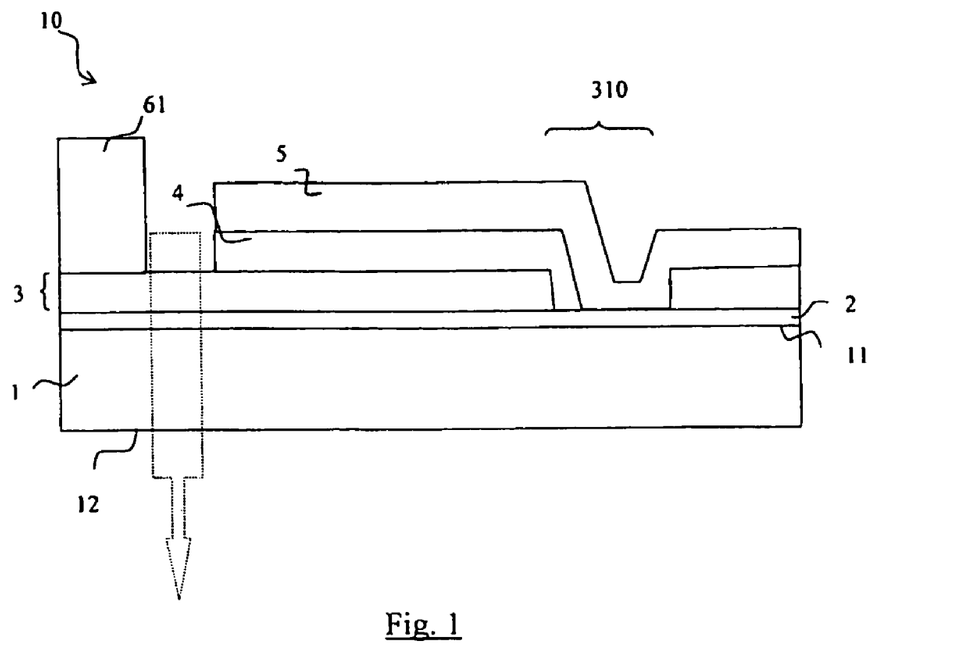
FIG. 1 is a schematic sectional view of an organic light-emitting device for uniform (back)lighting, which includes a bottom electrode according to the invention in a first embodiment.
Figure 2:
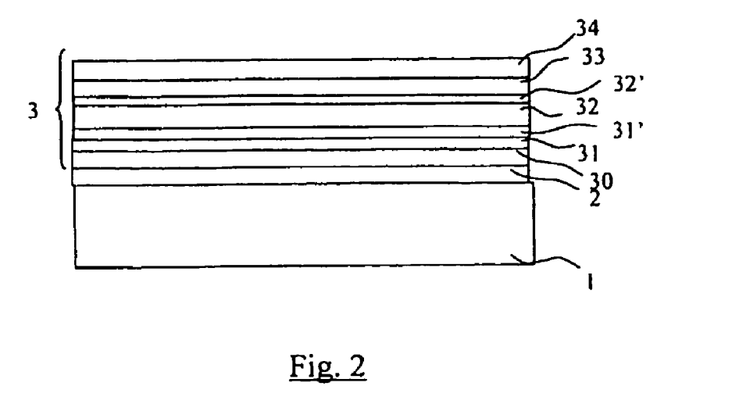
FIG. 2 is a partial view showing this bottom electrode in greater detail.

FIG. 1 is intentionally highly schematic. It shows in cross section an organic light-emitting device 10 (a bottom-emitting device, i.e. emitting through the substrate) comprising in succession:

a flat substrate 1 of clear or extra-clear soda-lime silica glass 2.1 mm in thickness, with first and second main faces 11, 12, the first main face 11 having:

a base layer 2 deposited directly on the first main face 11, also acting as etch stop layer, made of silicon nitride with a thickness of between 10 nm and 80 nm and covering substantially all of the first main face 11;

a bottom electrode (or electrode film) 3 deposited directly on the base layer 2, etched and chosen to be transparent, which includes a multilayer coating (see FIG. 2) of the type comprising:

a contact layer 31 chosen from ZnO$_x$, which is doped or undoped, Sn$_y$Zn$_z$O$_x$, ITO or IZO;

a functional layer 32 made of silver, preferably pure silver;

optionally a superjacent blocking film 32' directly on the functional layer 32;

a protective layer 33 chosen from ZnO$_x$, Sn$_y$Zn$_z$O$_x$, ITO or IZO, the contact layer and the protective layer, for protecting against water and/or oxygen, being of identical nature;

an overlayer 34, especially a work-function-matching overlayer;

i.e. preferably the multilayer coating ZnO:Al/Ag/Ti or NiCr/ZnO:Al/ITO having the following respective thicknesses: ZnO:Al 5 to 20 nm; silver 5 to 15 nm; Ti or NiCr 0.5 to 2 nm; ZnO:Al 5 to 20 nm; ITO 5 to 20 nm;

an organic light-emitting system 4, for example an SM-OLED of the following structure:

an alpha-NPD layer;

a TCTA+Ir(ppy)$_3$ layer;

a BPhen layer;

LiF layer;

a reflective, especially metallic, top electrode 5, in particular based on silver or aluminum.

A series of examples of deposition of multilayer coatings for producing the base layer 2 and the film 3 was carried out by magnetron sputtering at room temperature, generally on a substrate 1 of 4 mm thickness.

The table below indicates the nature and the thickness in nanometers of the various layers of these examples and the main characteristics of these examples.

The RMS roughness (or Rq) was measured by atomic force microscopy.

The deposition conditions for each of the layers were the following:
- the $Si_3N_4$:Al-based layers were deposited by reactive sputtering using an aluminum-doped silicon target at a pressure of 0.25 Pa in an argon/nitrogen atmosphere;
- the $SnZn:SbO_x$-based layers were deposited by reactive sputtering using an antimony-doped tin zinc oxide target comprising 65% Sn, 34% Zn and 1% Sb by weight, at a pressure of 0.2 Pa and in an argon/oxygen atmosphere;
- the silver-based layers were deposited using a silver target at a pressure of 0.8 Pa in a pure argon atmosphere;
- the Ti layers were deposited using a titanium target, at a pressure of 0.8 Pa in a pure argon atmosphere;
- the ZnO:Al-based layers were deposited by reactive sputtering using an aluminum-doped zinc target, at a pressure of 0.2 Pa and in an argon/oxygen atmosphere; and
- the ITO-based overlayers were deposited using a ceramic target in an argon/oxygen atmosphere, at a pressure of 0.2 Pa and in an argon/oxygen atmosphere.

TABLE

| | Examples | | | | | | |
|---|---|---|---|---|---|---|---|
| | 1 | 2 | 3 | 4 | 5* | 6* | 7 |
| Layers | | | | | | | |
| $SiO_2$ | | | | | | 150 nm | |
| ITO | | | | | | 90 nm | |
| 2: $Si_3N_4$:Al | 20 | 25 | 26 | 21 | 21 | | 20 |
| 30: $SnZn:SbO_x$ | | | | 5 | 5 | | |
| 31: ZnO:Al | 20 | 10 | 5 | 5 | 5 | | 20 |
| 32: Ag | 12 | 12 | 12 | 12 | 12 | | 30 |
| 32': Ti | | 1 | 1 | 1 | 0.5 | | |
| 33: ZnO:Al | 40 | 20 | 20 | 20 | | | 40 |
| 34: ITO | 20 | 20 | 20 | 20 | 10 | | 20 |
| $T_L$ (%) | 75 | 83 | 85 | 85 | 65 | 85 | 16 |
| $R_L$ (%) | 15 | 8 | 5 | 8 | 29 | 10 | 81 |
| Abs (%) | 10 | 9 | 10 | 7 | 6 | 5 | 3 |
| Sheet resistance (Ω/□) | 4.5 | 4.4 | 3.5 | 3.3 | 3.5 | 20 | 0.9 |
| RMS roughness (nm) | 1.2 | 1.3 | 0.9 | 0.7 | 0.7 | 1 | 1.3 |
| OLED performance (x and y coordinates)** | | | | | 20 (0.43; 0.45) | 15 (0.43; 0.43) | |
| Lifetime at 1000 $cd/m^2$ (in hours) | | | | | 25000 | 15000 | |

*on a substrate made of 0.7 mm thick soda-lime glass;
**at 1000 $cd/m^2$ with an optimized OLED system (in lm/W) for emitted white light having x and y coordinates, measured in the xy CIE colorimetry system, which are close to the desired illuminant A, i.e. x = 0.45 and y = 0.41.

In this structure, the electrode of the invention allows the efficiency in lm/W of the OLED to be improved by at least 5 to 10%, or 15% and even up to 20%, for a brightness greater than 500 $cd/m^2$ compared with an ITO electrode.

The first (bottom) electrode may as a variant include a subjacent blocking film 31' comprising in particular, like the superjacent blocking film 32', a metallic layer preferably obtained using a metal target with a neutral plasma, or a layer made of nitride and/or oxide of one or more metals such as Ti, Ni and Cr, preferably obtained using a ceramic target with a neutral plasma.

In examples 1 to 6, the electrode was a transparent electrode, with a light transmission of the coated substrate ≧50% and lying between 50% and 90%. In examples 1 to 4 according to the invention, this light transmission is high since it is between 75 and 85%. In example 5, which is also according to the invention, the light transmission is admittedly bottom, although still greater than 50%, but this is not necessarily a drawback since the absorption is very low. These examples 1 to 6 cannot be used as a reflective electrode since their light reflection is less than 70% nor as a transparent/reflective electrode since their $T_L/R_L$ ratio is not between 0.1 and 0.7.

In examples 4 and 5, the transparent electrode includes a smoothing layer 30, while in examples 1 to 3 there is no such smoothing layer. This smoothing layer enables the roughness of the overall multilayer coating to be reduced by about 10%, measured on the overlayer 34, while still improving the sheet resistance of the multilayer coating by about 5%.

Example 5 constitutes an example that was optimized so as to allow it to be compared with a counter-example, namely example 6, having a TCO (ITO) electrode. As may be seen in the above table, all the sheet resistance, roughness, performance and lifetime characteristics of example 5 were better than those of example 6.

In example 7, the coated substrate may be used as transparent/reflective electrode since this coated substrate has a $T_L/R_L$ ratio of 0.2, which is thus between 0.1 and 0.7. Moreover, this coated substrate has a light transmission of less than 50%, and is therefore not acceptable for producing a transparent electrode, but it could however also be accepted for producing a reflective electrode since its light reflection is greater than 70%.

The first electrode may also be an essentially reflective electrode.

The bottom electrode 3 extends along one side of the substrate 1. The border of the overlayer 34 is thus surmounted by a first metal current supply strip 61, preferably with a thickness of between 0.5 and 10 μm, for example 5 μm, and in the form of a layer made of one of the following metals: Mo, Al, Cr, Nd or an alloy such as MoCr, AlNd or a multilayer such as MoCr/Al/MoCr.

The bottom electrode 3 may as a variant have a structure repeated n times, where n is an integer equal to or greater than 1, this structure being the following: the contact layer/the functional layer/(the thin blocking layer)/(the water and/or oxygen barrier layer).

This structure is surmounted by a sequence comprising the contact layer/the functional layer/(the water and/or oxygen barrier layer)/said overlayer.

In the case of a stack of organic structures, for example emitting in the red, the green and the blue, in order to produce white light, it is also possible to repeat all the elements 3, 4, 5 three times or else simply to use a multilayer comprising: Al/ITO or Ag/optionally a thin similar blocking layer/ITO or Ag/optionally a thin similar blocking layer/ZnO/ITO for the additional bottom electrodes.

The top electrode extends along the opposite side from the substrate 1. This border of the top electrode 5 is optionally surmounted by a second metal current supply strip, preferably similar to the first metal strip. This second strip is preferable if the top electrode has a thickness of 50 nm or less.

The second electrode may in fact also be, as a variant, a transparent or semitransparent electrode and for example may be identical or similar to the first electrode. Optionally in this case, a reflector is added to the second face 12, for example a metallic layer 150 nm in thickness.

An EVA sheet can be used to laminate the substrate 1 to another glass pane, preferably having the same characteristics as the substrate 1. Optionally, the face 12 of the glass pane 1 turned toward the EVA sheet is provided with a multilayer coating of given functionality described later.

The bottom electrode 3 is made in two parts separated by the etching zone 310.

Wet etching is used to electrically separate the bottom electrode 3 from the top electrode 5 of the device 10.

To etch the entire bottom electrode (contact layer, functional layer, optional superjacent blocking film or layer, optional protective layer and overlayer) in one and the same etching pattern and in one operation, the layers—partly masked beforehand using an acid-resistant adhesive tape or as a variant using a photolithography mask—are exposed to one of the following acid solutions:

HCl (for example of 40% concentration);
or HCl (for example of 4% concentration);
or an HCl (4% concentration for example)/$HNO_3$ (for example 7% concentration) mixture;
or an KU $FeCl_3$ mixture; or
$HNO_3$ with a concentration between 10 and 18%.

Etching with hydrochloric acid results in very uniform etching profiles. Etching with the nitric acid/hydrochloric acid mixture also gives useful results. The HCl/$FeCl_3$ mixture is used conventionally in the case of ITO.

The etching profile, the etching time and the resolution may be adapted using mixtures of the two acids and by varying the concentrations.

Thus, it is possible to etch patterns with the width and spacing varying depending on the applications.

For small passive-matrix OLED screens (for the display of an electronic apparatus—mobile telephone, display, personal assistant, MP3 reader, etc.), the width of each etched zone may be typically 10 to 20 μm, each etched zone being spaced apart by 10 to 50 μm, for example 35 μm (corresponding to the width of each electrode zone).

In the case of large passive-matrix OLED screens, for example for advertising or indicating displays, the width of each etched zone may be around 0.5 mm and the width of each electrode zone may be a few mm, a few cm or more, etc.

For uniform lighting, the width of each etched zone may be equal to or less than 100 μm, more preferably equal to or less than 50 μm, irrespective of the size of the screen.

Figure 3:
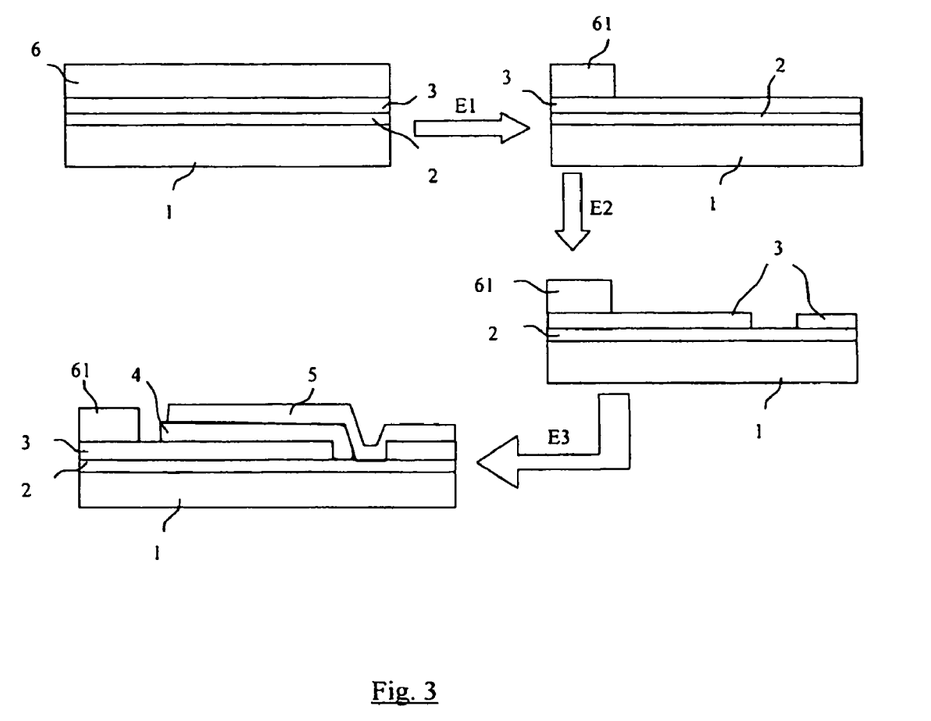
FIG. 3 illustrates a process for fabricating and etching this electrode.

FIG. 3 illustrates a process for fabricating and etching this electrode.

After the base layer 2, the electrode 3 and the metallic current supply layer 6 (whether a monolayer or a multilayer) have been deposited, this layer 6 is etched with a solution that does not etch the electrode, for example sodium hydroxide (step E1) and then the bottom electrode 3 is etched in a single step as already indicated (step E2), followed by the deposition of the OLED system 4 and the top electrode 5, for example made of Al, thereon (step E3).

Figure 4:
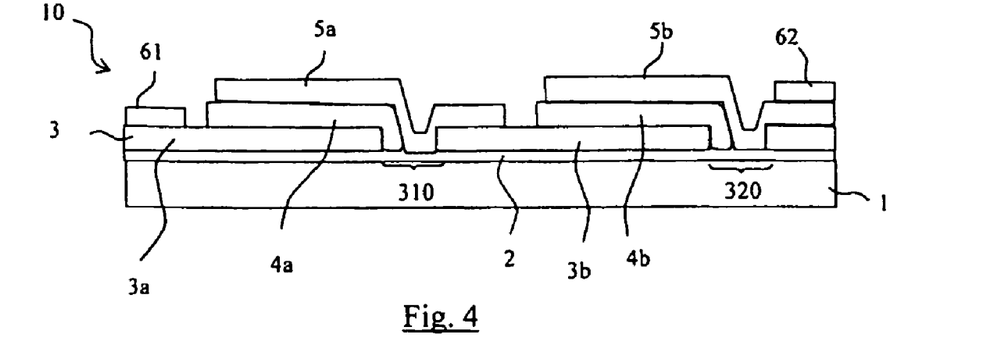
FIG. 4 illustrates a schematic sectional view of an organic light-emitting device for uniform (back)lighting, which is arranged in several zones and includes a bottom electrode according to the invention in a second embodiment.

FIG. 4 illustrates a schematic sectional view of an organic light-emitting device 10, for uniform (back)lighting, which is arranged in several zones and comprises a bottom electrode according to the invention in a second embodiment.

This second device differs from the first device by the elements described below.

The device 10 illustrated in FIG. 4 comprises two adjacent organic light-emitting systems 4a and 4b, each preferably emitting white light or, as a variant, in series of threes, red, green and blue light. The systems 4a and 4b are connected in series. The bottom electrode is mainly divided into two rectangles or squares 3a, 3b having sides of around ten cm, each extending beyond the OLED system on one side (on the left in the figure). These electrode zones are separated by the etching zone 310. The second electrode zone 3b is separated by the etching zone 320 from a "residual" bottom electrode zone (on the right in the figure). The first bottom electrode section 3a is partially covered with a first metal strip forming a busbar producing a bus electrode structure 61.

The top electrode is also divided. The first top electrode section 5a extends toward the right side and covers the left edge of the second bottom electrode section 3b. The second top electrode section 5b extends toward the right edge and covers the left edge of the residual bottom electrode section and is covered by a second metal strip forming a busbar, producing a bus electrode structure 62.

The etching zones 310, 320 are for example strips from 20 to 50 μm in width so as to be almost invisible to the naked eye.

Figure 5:
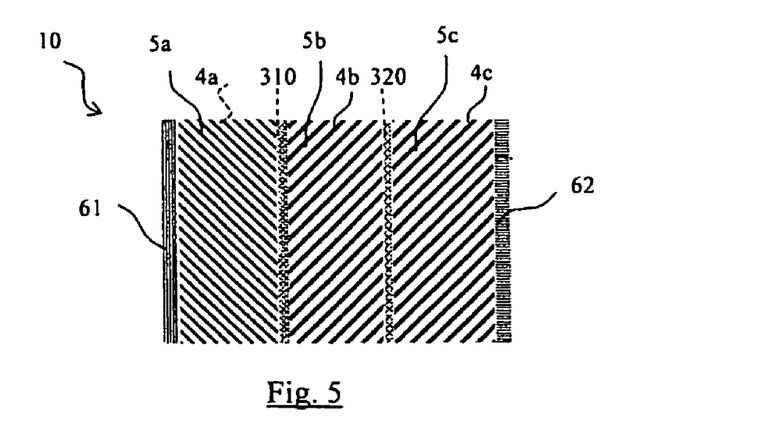
FIGS. 5 and 6 illustrate schematic top views showing two diagrams for electrically connecting electrodes similar to those used in the second embodiment.
Figure 6:
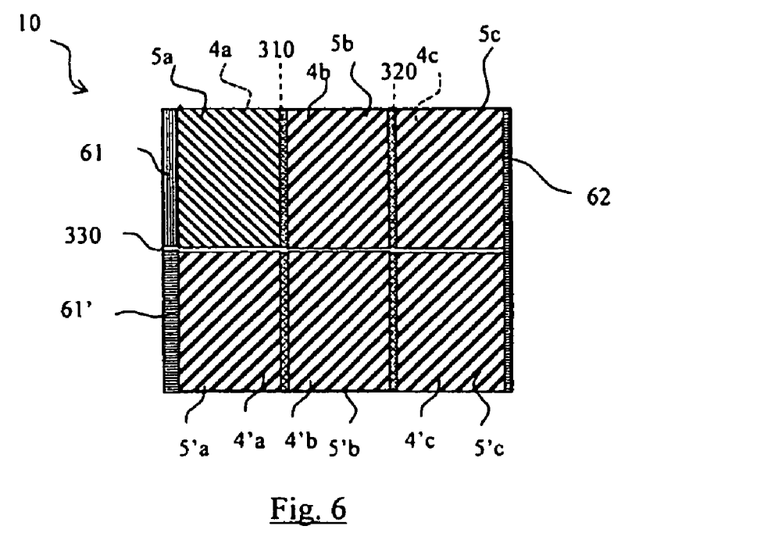

FIGS. 5 and 6 illustrate schematic top views showing two schemes for electrically connecting electrodes similar to those used in the second embodiment.

In FIG. 5, three organic light-emitting systems 4a to 4c are connected in series. The etching zones 310 and 320 are strips 20 to 50 μm in width, so as to be almost invisible to the naked eye.

The bottom electrode is divided into three rectangles each having sides of around ten cm in width, each extending on one side (the left in the figure). They are separated by etching zones 310, 320. The top electrode 5a to 5c is also divided into three. The first bottom electrode section is partially covered by a first metal strip forming a busbar, producing a bus electrode structure 61.

The first two top electrode sections 5a, 5b extend toward the right side and cover the left edge of the adjacent bottom electrode section. The third top electrode section 5c extends toward the right side and covers the left edge of a residual bottom electrode section and is partially covered by a second metal strip forming a busbar, producing a bus electrode structure 62.

In FIG. 6, six organic light-emitting systems 4a to 4c, 4'a to 4'c are connected in two mutually parallel series (one series of three systems 4a to 4c at the top of the figure and one series of three systems 4a' to 4c' at the bottom of the figure). The etching zones 310 to 330 are both lateral 310, 320 and longitudinal 330, and are strips 20 to 50 μm in width so as to be almost invisible to the naked eye.

The bottom electrode is divided into six squares having sides of around ten cm, each extending on one side (the left in the figure). The bottom electrode sections are separated by the etching zones 310 to 330. The first strip forming a busbar is cut so as to form a current collector with two strips of two bus electrode structures 61, 61' on the left side of the figure.

The top electrode 5a to 5c, 5' a to 5' c is also divided into six. The first two top electrode sections 5a and 5b (in the top left of the figure) extend toward the right side and cover the left edge of the third section of the adjacent bottom electrode.

The third top electrode section 5b extends toward the right side and covers the left edge of the residual bottom electrode section and is covered by a metal strip producing a bus electrode structure 62 and forming an electrical interconnection between the third top electrode sections 5c and 5c' (on the right in the figure).

The first two bottom top electrode sections 5'a and 5' b (bottom left in the figure) extend toward the right side and cover the left edge of the third bottom section of the adjacent bottom electrode.

Figure 7:
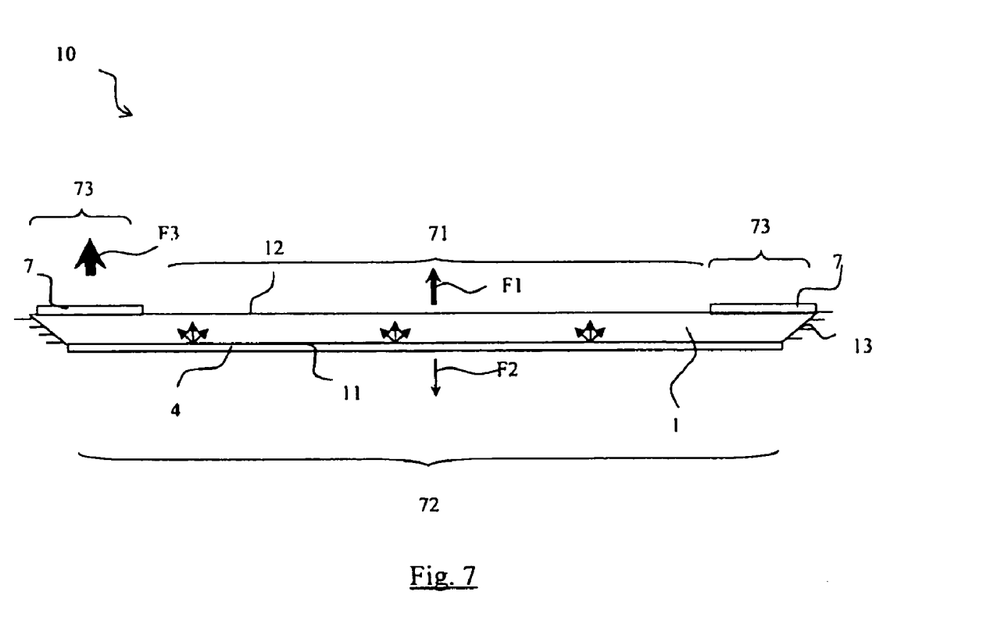
FIG. 7 is a schematic lateral sectional view of an organic light-emitting device used for differentiated lighting.

FIG. 7 shows a schematic lateral sectional view of an organic light-emitting device 10 used for differentiated lighting.

This device 10 firstly comprises a flat transparent substrate 1, preferably consisting of a preferably thick glass sheet, for example 4 or 6 mm in thickness, with an absorption coefficient in the visible of 2.5 m$^{-1}$ or less. It is preferable to choose an extra-clear soda-lime glass having an absorption coefficient in the visible of less than 0.7 m$^{-1}$. This glass is provided with first and second parallel main faces 12, 11 and with an end face 13. The device is closed off in its bottom part by a cover (not illustrated here).

The OLED-type light-emitting device 10 includes an OLED system 4 having a bottom electrode of the ZnO:Al$_{20\,nm}$/Ag$_{12\,nm}$/Ti$_{1\,nm}$/ZnO:Al$_{20\,nm}$/ITO$_{20\,nm}$ type on a 25 nm Si$_3$N$_4$ base layer placed on the first main face 11. First direct light zones 71, 72 on either side of the substrate 1 are defined.

The first direct light zone 71, on the opposite side from the OLED system 4 with respect to the substrate 1, covers the central portion of the second main face 12. The second direct light zone 72, on the same side as the OLED system 4, extends beneath the entire first main face 11.

The characteristics of the device 10 are adapted so that the luminance L1 of the first direct light zone 71 is preferably greater than the luminance L2 of the second direct light zone 72 (as shown symbolically by the thick arrow F1 and the thin arrow F2).

To have L1 greater than L2, the device 10 is therefore emitting mainly via the bottom electrode. For example, L1 is chosen to be equal to about 1000 cd/m$^2$ and L2 equal to about 500 cd/m$^2$ for visual comfort.

The device 10 is also a source of radiation guided in the thickness of the substrate 1, by total internal reflection. The guided radiation is extracted from the edges of the second face 12 by means of a diffusing layer 7, for example based on mineral scattering particles dispersed in a mineral binder. Thus, a third light zone 73 forming a peripheral luminous frame is defined. As a variant, the diffusing layer 7 forms only lateral bands or peripheral longitudinal bands.

The device 10 is also a source of radiation guided in the thickness of the substrate 1, by total reflection. The guided radiation is extracted from the edges of the second face 12 by means of a diffusing layer 7, for example based on mineral scattering particles dispersed in a mineral binder. Thus, a third light zone 73 forming a peripheral luminous frame is defined. As a variant, the diffusing layer 7 forms only lateral bands or peripheral longitudinal bands.

To promote extraction of the guided radiation, each of the edges forming the end face 13 makes an internal angle of greater than 90° and about 100°, with the first main face 11 and includes a mirror, for example a metallic silver or copper layer.

The luminance L3 of the third light zone 73 is preferably greater than the luminance L1 of the first direct light zone 71 (as shown symbolically by the very thick arrow F3).

The device 10 may be intended for buildings, as an illuminating window, an illuminating door, a greenhouse wall or glass roof, or else a vehicle side window or an illuminating roof. The second face 12 is the inner face (the most illuminating face).

When the device 10 is lit, the central direct light zone 71 can preserve the privacy of a person inside a room or passenger compartment at night or in a dark environment. To do this, all that is required is for the light flux delivered by the glazing to be at least equal to that reflected and returned via the room.

The device 10 may form a double glazing unit, the device 10 preferably being located in the internal gas-filled space between the substrate 1 and an optionally thinner additional glass pane.

The device 10 thus designed may also serve as an illuminating transparent shelf, luminous refrigerator shelf, illuminating transparent partition between two rooms or an aquarium wall. The characteristics of the device 10 may therefore be adapted so that the luminance L1 of the first direct light zone 71 is approximately equal to the luminance L2 of the second direct light zone 72.

The light zones 71, 72 are uniform. As a variant, the device 10 may also have at least one direct light zone which is discontinuous and/or forms a design, logo or indication.

Additional Functions

As already stated, it may be judicious to functionalize the second face of the carrier substrate 1 (on the opposite side from the organic light-emitting system).

Thus, thin layers are deposited on the surface that are intended to give them a particular property, such as for example that consisting in allowing the substrate to remain as clean as possible, irrespective of environmental attack, i.e. for the purpose of maintaining over time the surface properties and appearance, and in particular enabling the cleaning operations to be spaced further apart, by succeeding in eliminating dirt progressively as this builds up on the surface of the substrate, especially dirt of organic origin, such as fingerprints or volatile organic substances in the atmosphere, or even dirt of the sweat or pollution dust type.

In the field of substrates having a glazing function, it is known to use photocatalytic films on a substrate, which have a pronounced "antisoiling" effect and can be manufactured on an industrial scale. These photocatalytic films generally contain at least partially crystalline titanium oxide incorporated into said film in the form of particles, especially with a size of between a few (3 or 4) nanometers and 100 nm, preferably about 50 nm, essentially being crystallized in anatase or anatase/rutile form.

This is because titanium oxide is one of the semiconductors which, under the action of light in the visible or ultraviolet range, degrade organic substances that are deposited on their surfaces.

Thus, according to a first exemplary embodiment, the film having a photocatalytic property results from a solution based on TiO$_2$ nanoparticles and a mesoporous silica (SiO$_2$) binder.

According to a second exemplary embodiment, the film having a photocatalytic property results from a solution based on TiO$_2$ nanoparticles and a nonstructured silica (SiO$_2$) binder.

Furthermore, irrespective of the embodiment of the photocatalytic film as regards the titanium oxide particles, these have been chosen to be based on at least partially crystalline titanium oxide because it has been shown that this is much more effective in terms of photocatalytic property than amorphous titanium oxide. Preferably, the oxide is crystallized in anatase form, rutile form or in the form of an anatase/rutile mixture.

The film having a photocatalytic property may also include, apart from titanium oxide, at least one other type of mineral material, especially in the form of an amorphous or partially crystalline oxide, for example a silicon oxide (or mixture of oxides), titanium oxide, tin oxide, zirconium oxide or aluminum oxide. This mineral material may also participate in the photocatalytic effect of the crystalline titanium oxide, by having itself a certain photocatalytic effect, albeit small compared with that of crystalline TiO$_2$, which is the case with amorphous or partially crystalline titanium oxide.

The thickness of the film can vary between a few nanometers and a few microns, typically between 50 nm and 10 μm.

In fact, the choice of thickness may depend on various parameters, especially the envisioned application of the substrate, or else on the size of the $TiO_2$ crystallites in the film. The film may also be chosen to have a relatively smooth surface—this is because a low surface roughness may be advantageous if it allows a larger active photocatalytic area to develop. However, too pronounced a roughness may be detrimental, by promoting the incrustation and accumulation of dirt.

According to another variant, the functionality provided on the other face of the substrate may be formed by an antireflection film.

Given below are the preferred ranges of the geometric thicknesses and indices of the four multilayer antireflection coating, this coating being called A:

- $n_1$ and/or $n_3$ are between 2.00 and 2.30, especially between 2.15 and 2.25 and preferably close to 2.20;
- $n_2$ and/or $n_4$ are between 1.35 and 1.65;
- $e_1$ is between 5 and 50 nm, especially between 10 and 30 nm, or between 15 and 25 nm;
- $e_2$ is between 5 and 50 nm, especially equal to or less than 35 nm or 30 nm, being in particular between 10 and 35 nm;
- $e_3$ is between 40 and 180 nm and preferably between 45 and 150 nm; and
- $e_4$ is between 45 and 110 nm and preferably between 70 and 105 nm.

The most appropriate materials for forming the first and/or third layers of the antireflection coating A, namely those having a high index, are based on silicon nitride or zirconium nitride or on a mixture of these nitrides. As a variant, these high-index layers are based on silicon nitride or tantalum nitride or a mixture of these ?. All these materials may be optionally doped so as to improve their chemical and/or mechanical and/or electrical resistance properties.

The most appropriate materials for forming the second and/or fourth layers of the coating A, namely those having a low index, are based on silicon oxide, silicon oxynitride and/or silicon oxycarbide or else based on a mixed silicon aluminum oxide. Such a mixed oxide tends to have better durability, especially chemical durability, than pure $SiO_2$ (an example of this is given in the patent EP 791 562). The respective proportion of the two oxides may be adjusted in order to improve the expected durability without excessively increasing the refractive index of the layer.

A preferred embodiment of this antireflection coating is of the form: substrate/$Si_3N_4$/$SiO_2$/$Si_3N_4$/$SiO_2$.

It goes without saying that the invention is applicable in the same way to systems using light-emitting devices other than those described in the examples.

The present invention has been described in the foregoing by way of example. Of course, a person skilled in the art will be capable of producing various alternative forms of the invention without thereby departing from the scope of the patent as defined by the claims.

The invention claimed is:

1. A substrate for an organic light-emitting device, comprising, on a first main face, a bottom electrode film, the electrode film being formed from a thin-film multilayer coating comprising, in succession:

a contact layer comprising at least one of zinc oxide and tin zinc oxide and no indium a metallic functional layer having an intrinsic electrical conductivity property and a thickness of from 3 to 20 nm, wherein the metal functional layer comprises silver; and an overlayer comprising at least one of the following, optionally doped, metal oxides: molybdenum oxide, indium oxide, a mixed indium tin oxide, a mixed indium zinc oxide, and a mixed zinc tin oxide, wherein the substrate comprises a base layer, said base layer covering said main face and not comprising indium.

2. The substrate according to claim 1, wherein the base layer has a thickness of between 10 and 150 nm.

3. The substrate according to claim 1, wherein the substrate comprises an etch stop layer between the base layer and the contact layer.

4. The substrate according to claim 1, wherein a combination of layers comprising the contact layer, the functional layer, the overlayer, and all the layers located between the contact layer and the overlayer, are etched in the same etch pattern.

5. The substrate according to claim 1, wherein the substrate has, a light transmission $T_L$ equal to or greater than 50% and, an absorption of $1-R_L-T_L$ equal to or less than 15%, wherein $R_L$ is light reflectance.

6. The substrate according to claim 1, wherein the substrate has, on the overlayer, an RMS roughness equal to or less than 3 nm.

7. The substrate according to claim 1, wherein the contact layer is doped.

8. The substrate according to claim 1, wherein the overlayer matches a work function of the electrode film.

9. The substrate according to claim 8, wherein the overlayer has a thickness of from 3 to 50 nm.

10. The substrate according to claim 1, wherein metallic the functional layer is directly on at least one subjacent blocking film, directly beneath at least one superjacent blocking film, or the metallic functional layer is directly on at least one subjacent blocking film and is directly beneath at least one superjacent blocking film.

11. The substrate according to claim 1, wherein at least one blocking film comprises at least one of a metallic layer, a metal nitride layer and a metal oxide layer, where the metal comprises at least one of: Ti, V, Mn, Fe, Co, Cu, Zn, Zr, Hf, Al, Nb, Ni, Cr, Mo, Ta, W, and an alloy thereof.

12. The substrate according to claim 1, wherein the substrate comprises, between the base layer and the contact layer, a noncrystalline smoothing layer comprising a mixed oxide, said smoothing layer being positioned immediately beneath said contact layer and comprising a material other than a material of the contact layer.

13. The substrate according to claim 12, wherein the smoothing layer is a mixed oxide layer comprising one or more oxides of: Sn, Si, Ti, Zr, Hf, Zn, Ga, and In.

14. The substrate according to claim 12, wherein the smoothing layer is a mixed oxide layer of mixed zinc and tin oxides, mixed indium and zinc oxides, or mixed indium and tin oxides.

15. The substrate according to claim 12, wherein the smoothing layer has a thickness of from 0.1 to 30 nm.

16. The substrate according to claim 1, comprising one or more functional layers deposited n times on the base layer and an optional etch stop layer, where n is an integer equal to or greater than 1, wherein the substrate comprises a structure having a sequence of contact layer/functional metallic layer/overlayer.

17. The substrate according to claim 1, comprising a bottom bus electrode structure above the bottom electrode film, said bus electrode structure being in electrical contact with the bottom electrode film.

18. The substrate according to claim 1, comprising an OLED system above the bottom electrode film.

19. The substrate according to claim 1, comprising a top electrode film above said OLED system.

20. The substrate according to claim 1, comprising a top bus electrode structure above the top electrode film, said bus electrode structure being in electrical contact with said top electrode film.

21. The substrate according to claim 1, the substrate coated with the base layer and with the bottom electrode film comprises a toughenable substrate coated with a thin-film multilayer coating.

22. The substrate according to claim 1, comprising, on a second main face, at least one functional film selected from the group consisting of: an antireflection multilayer, an antifogging layer, antifouling layer, an ultraviolet filter, a titanium oxide layer, a phosphor layer, a mirror layer and a light extraction scattering zone.

23. The substrate according to claim 1, comprising a bottom bus electrode structure, an OLED layer above the bottom electrode film, a top electrode film above said OLED system and a top bus electrode structure.

24. An organic light-emitting device comprising the substrate according to claim 1.

25. A glazing unit comprising the organic light-emitting device according to claim 24.

26. The organic light-emitting device according to claim 24, comprising a plurality of adjacent organic light-emitting systems, each emitting white light or, by a series of three systems, red light, green light and blue light, the systems being connected in series.

27. A luminous surface comprising the organic light-emitting device according to claim 24.

28. A process for fabricating the substrate according to claim 1, comprising depositing at least the base layer and the electrode film on the substrate.

29. The process according to claim 28, further comprising etching the electrode film, wherein the etching is an acid etching operation carried out in one step with an acid solution selected from the group consisting of pure nitric acid $HNO_3$, nitric acid mixed with hydrochloric acid HCl, pure hydrochloric acid and hydrochloric acid mixed with iron trichloride $FeCl_3$.

30. The process according to claim 28, further comprising etching the electrode film, wherein the etching is carried out in the presence of at least one metal current supply strip of a monolayer of: Mo, Al, Cr, or an alloy thereof, or in the presence of at least one metal current supply strip of a mutilayer.

31. The process according to claim 30, wherein the monolayer comprises a MoCr alloy or a MoCr/Al/MoCr alloy.

32. The substrate according to claim 9, wherein the at least one metal oxide is doped.

33. The substrate according to claim 1, wherein the contact layer has a thickness of from 3 to 20 nm.

34. The substrate according to claim 1, wherein the base layer comprises silicon oxide, silicon oxycarbide, silicon nitride, silicon oxynitride, silicon oxycarbonitride, or a combination thereof.

35. The substrate according to claim 1, further comprising a tin oxide etch stop layer between the base layer and the contact layer.

36. The substrate according to claim 35, wherein the etch stop layer has a thickness of between 20 and 60 nm.

* * * * *